United States Patent [19]
Kato

[11] Patent Number: 5,536,972
[45] Date of Patent: Jul. 16, 1996

[54] POWER MODULE

[75] Inventor: Hazime Kato, Itami, Japan

[73] Assignee: Mitsubishi Denki Kabushiki Kaisha, Tokyo, Japan

[21] Appl. No.: 351,633

[22] Filed: Dec. 7, 1994

[30] Foreign Application Priority Data

Dec. 9, 1993 [JP] Japan ................................. 5-309166

[51] Int. Cl.⁶ ............................ H01L 23/10; H01L 23/34
[52] U.S. Cl. ............................................. 257/706; 257/707
[58] Field of Search ..................................... 257/723, 724, 257/706, 707, 720

[56] References Cited

U.S. PATENT DOCUMENTS

5,291,065  3/1994  Arai et al. ............................... 257/723

*Primary Examiner*—Sara W. Crane
*Assistant Examiner*—S. V. Clark
*Attorney, Agent, or Firm*—Leydig, Voit & Mayer

[57] ABSTRACT

A power module having a reduced cost and a smaller size is achieved by utilizing a reduced number of MOS-FET devices owing to improved heat radiation, smaller substrates owing to, a higher degree of freedom of wiring, and a reduced quantity of silicone get required. Heat generating elements including a MOS-FET and a resistor are soldered to a metallic heat radiating plate via a copper heat sink, alumina insulating plate, or the like. A circuit pattern for the heat generating elements is formed on a metallic substrate provided above the metallic heat radiating plate. Openings are made in the metallic substrate at the points located above the heat generating elements and the heat generating elements are connected to the metallic substrate with aluminum wires through the openings. Further, rings surrounding the heat generating elements are provided between the metallic heat radiating plate and the metallic substrate, a protective material being charged in the rings.

12 Claims, 5 Drawing Sheets

POWER MODULE

BACKGROUND OF THE INVENTION

1. Field of the Invention

The present invention relates to a power module for motor drive control and other applications which involve the control of a relatively large current.

2. Description of the Related Art

Figure 7:
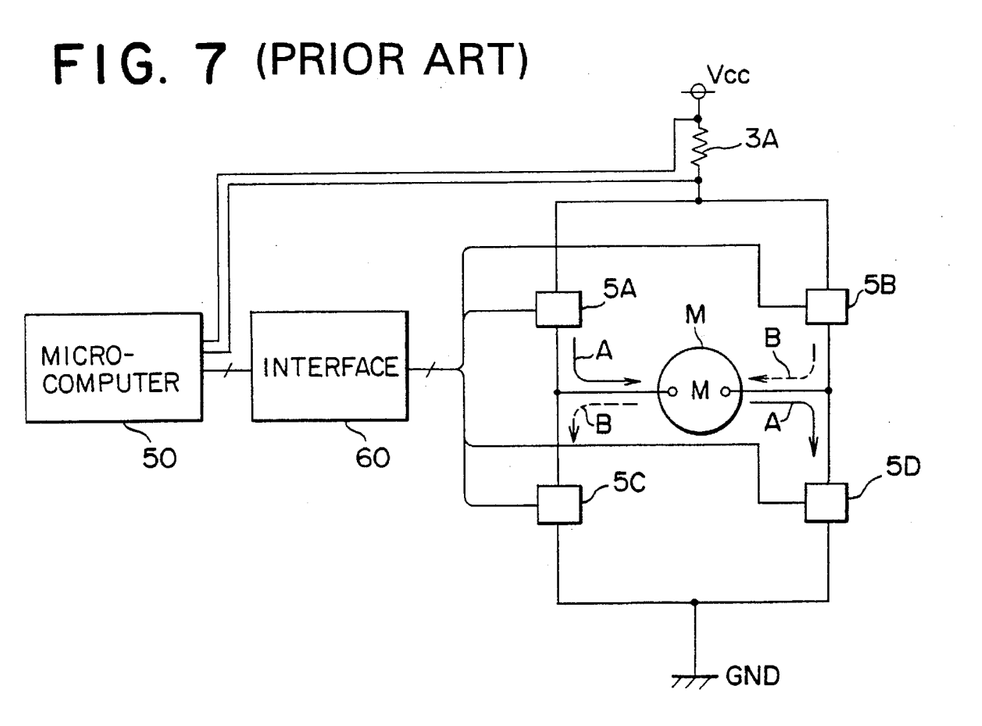
FIG. 7 is a circuit diagram of a power module for motor control.

A description is given of a power module which is used, for example, for motor drive control in an automotive power steering system. FIG. 7 shows the outline of a control circuit of the motor. Connected to motor M is an H bridge circuit which includes four switches 5A through 5D comprised of MOS-FETs. For instance, if switches 5A and 5D are turned ON and a current is allowed to flow in the direction of arrow A shown by a solid line, then motor M rotates in the forward direction; if switches 5B and 5C are turned ON, then the current flows in the direction of arrow B shown by a dashed line, causing motor M to rotate in the reverse direction. The rotational speed of the motor M is controlled by changing, for example, the duty ratios of the control pulses supplied to the switches (PWM), thereby changing the current flowing through motor M. Reference numeral 3A denotes a resistor for detecting overcurrent. A microcomputer 50 performs the control of the motor M via an interface 60, the control including primarily the supply of control pulses to the switches 5A through 5D and the detection of an overcurrent. The microcomputer 50 and the interface 60 both operate on a low-voltage circuit of 5 V (volts) with a current in the order of mA (milliampere), while a large current ranging, for example, from 50 to 75 A (amperes) flows through the H bridge circuit which includes motor M, switches 5A through 5D, and resistor 3A for detecting overcurrent. Switches 5A through 5D control a large current in accordance with a low-voltage control pulse supplied from the microcomputer 50 via the interface 60.

FIG. 8 shows a cross-sectional view of conventional power module. In the drawing, numeral 100 denotes a power module, numeral 1 a heat radiating container made of aluminum or copper, numeral 1a a serrated section for improving heat radiation by increasing the surface area, and numeral 2 a metallic substrate which is constituted by an aluminum plate 2a on which a resinous insulating layer 2b made of epoxy resin or the like, and which is approximately 15 to 30 μm thick is formed. Numeral 2c denotes a pin which fixes the metallic substrate 2 to the heat radiating container 1, and numeral 2d denotes silicone grease for improving the heat conduction between the metallic substrate 2 and the heat radiating container 1. Numeral 3 indicates a resistor such as a shunt resistor for detecting overcurrent, numeral 4 a copper heat sink, numeral 5 a MOS-FET which is a semiconductor device which constitutes the switch of FIG. 7, numeral 6 an aluminum wire which connects the MOS-FET 5 and the circuit pattern on the metallic substrate 2, numeral 7 a lead wire which is set on the circuit pattern 21 of the metallic substrate 2 and which is used for external connection, numeral 8 an insulated circuit board which is made of glass epoxy resin or the like and on which the control circuit for the MOS-FET 5 is mounted, numeral 8a a control package which incorporates the microcomputer 50, the interface 60, etc. of FIG. 7, numeral 9 a lead wire which electrically connects the metallic substrate 2 and the circuit board 8, and numeral 11 a silicone gel which is a protective material (coating resin) for moisture proofing effect.

Although FIG. 8 shows only one MOS-FET 5, at least four MOS-FETs 5 are required as shown in the circuit of FIG. 7, and the MOS-FETs 5 are mounted on the metallic substrate 2. In actual use, however, four or more MOS-FETs are normally mounted because the switches 5A and 5B shown in FIG. 7 must be constituted by connecting a plurality of MOS-FETs in parallel to allow a smaller current to flow through each of the MOS-FETs 5 and minimize the ON resistance, thus dispersing and reducing the heat generated in the MOS-FETs 5. Likewise, a plurality of resistors 3 are mounted thereon. The circuit board 8 is fixed to the heat radiating container 1 with an adhesive agent or the like which is not shown.

A large current flows into the H bridge circuit which comprises the MOS-FETs 5 and the resistors 3 for detecting overcurrent, and which is designed to drive and rotate the motor in the forward and reverse directions, accordingly, the H bridge circuit generates a great deal of heat. For this reason, the H bridge circuit is mounted on the metallic substrate 2 which features high heat conductivity and good heat radiation. On the other hand, the circuit board 8 with a circuit mounted thereon through which a minute current for controlling the operation of the MOS-FETs 5 flows does not require heat radiation; therefore, it is installed in a position isolated from the metallic substrate 2 so as to be free from the influences exerted by heat radiated from the metallic substrate 2.

A brief description is given of the connection between the circuit pattern 21, which is made of copper or the like and which is mounted on the insulating layer 2b of the metallic substrate 2, and other parts. An aluminum layer is formed on the circuit pattern 21 to which the aluminum wire 6 is connected, the aluminum wire 6 being connected and fixed to the aluminum layer by aluminum wire bonding. The resistor 3, the copper heat sink 4, and the lead wire 7 for external connection are connected and fixed onto the circuit pattern 2t by soldering. The MOS-FETs 5 are also fixed onto the copper heat sink 4 by soldering. The circuit pattern 21 on the metallic substrate 2 measures about 100 μm thick and 7 mm wide to allow a current of 50A to 75A to flow through and it connects the MOS-FETs 5 with the elements such as the resistors 3.

In the conventional power module configured as described above, it is necessary to provide the surface of the metallic substrate, on which the heat radiating MOS-FETs and resistors are mounted, with a resinous insulating layer to form the circuit pattern 21 for connecting the heat radiating components on the metallic substrate. Such a resinous layer, however, has extremely low heat conductivity, resulting in poor heat radiation of the whole heat radiation passage from the metallic substrate 2 and the aforesaid heat radiating elements to the heat radiating container. Accordingly, as described above, in order to minimize the current flowing through the MOS-FETs and the ON resistance, the plurality of MOS-FETs are connected in parallel to constitute a single switch, thus controlling the heat generated in the MOS-FETs; however, increasing the number of devices led to lower wiring efficiency and a larger board.

To cope with the problem, above described a direct bond copper (DBC) substrate or an aluminum nitride (AlN) substrate is utilized instead of the metallic substrate 2, the DBC substrate and the AlN substrate being made of an alumina ($Al_2O_3$) plate and an aluminum nitride (AlN) plate, respectively, provided with a nickel (Ni) layer and a copper (Cu) layer on the surfaces of the plates, respectively, to metallize the plates. Then the metallized substrate is soldered to the heat radiating container which has a plated surface. This, however, posed the following problem.

The DBC substrate or the AlN substrate described above is electrically insulated and it exhibits better heat radiation than the metallic substrate; however, the alumina and the aluminum nitride are castings and are prone to break and are mechanically weak at the electrodes thereof, in particular, the portions where the external connection lead wire 7 is installed. In addition, this type of substrate has a considerable difference in the coefficient of thermal expansion between the alumina plate or the aluminum nitride plate, which is a casting, and the surface nickel or copper layer which is metallic. Hence, making the substrate larger unavoidably increases the thermal stress (the larger the substrate, the larger the warp). As a result, the substrate tends to break when it is subjected to the heat from soldering it to the heat radiating container or the heat generated by switching many MOS-FETs (thermal fatigue).

There is another problem associated with this design. The aluminum wire needs to be covered with silicone gel for moisture proof effect; in the case of the conventional power module having the structure explained above, the whole cavity in the heat radiating container 1, where the metallic substrate 2 is disposed, must be filled with silicone gel, requiring a large quantity of silicone gel. Thus, the conventional power module had the problems described above.

SUMMARY OF THE INVENTION

Accordingly, an object of the present invention is to provide a power module which requires fewer devices such as MOS-FETs, a smaller board, and a reduced volume of required silicone gel, thereby achieving reduced cost and reduced size.

To this end, according to a first aspect of the present invention, there is provided a power module comprising: a heat radiating element with good heat conductivity, a heat generating element which is soldered to the heat radiating element via an insulating plate, a metallic substrate which is disposed above the heat radiating element and which has a circuit pattern formed on the top surface thereof for the heat generating element, an opening being provided in a position matching the heat generating element, and a metallic wire for connecting the circuit pattern with the heat generating element through the opening in the metallic substrate.

According to a second aspect of the present invention, there is provided a power module as described above further comprising a ring which is held between the heat radiating element and the metallic substrate and which surrounds the heat generating element, and a protective material charged in the ring to cover the heat generating element and the metallic wire.

According to a third aspect of the present invention, there is provided a power module as described above wherein the heat generating element is equipped with a bonding base to which the metallic wire is connected and fixed.

In the power module in accordance with the first aspect of the present invention, all the heat generating elements such as MOS-FETs are soldered onto a metallic heat radiating plate made of an aluminum plate or the like with a plated surface via an insulating plate such as an alumina insulator and aluminum nitride insulating plate, and the circuit pattern for the heat generating element is formed on a metallic substrate disposed above the metallic heat radiating plate. The metallic substrate is provided with openings above the heat generating elements. The heat generating elements and the metallic substrate are connected with aluminum wires through the openings. This arrangement eliminates the need for providing the metallic heat radiating plate having the heat generating elements mounted on with a resinous insulating layer required for forming the circuit pattern or the like. As a result, the heat radiating effect is improved because of the absence of the resinous layer in the heat radiating passage of the heat generating elements. In addition, the improved heat radiation of the metallic heat radiating plate reduces the need for decreasing the current and ON resistance by connecting a plurality of MOS-FETs in parallel (the number of MOS-FETs can be reduced) as in the conventional power module. Moreover, the use of the three-dimensional structure comprised of the plate and the substrate, namely, the metallic heat radiating plate with the heat generating elements mounted thereon and the metallic substrate with the circuit pattern formed thereon, permits a simpler connection between the heat generating elements and the circuit pattern of the metallic substrate with aluminum wires through the openings provided in the metallic substrate at desired points. This simplifies the wiring of the circuit pattern and permits reduced sizes for the substrate, resulting in a reduced size of the whole power module.

In the power module according to the second aspect of the present invention, the protective material for moisture-proofing the MOS-FETs and aluminum wires has to be charged only in the rings which surround the MOS-FETs. Thus, the required quantity of the protective material can be reduced.

In the power module according to the third aspect of the present invention, the heat generating elements, especially the resistors, are provided with aluminum bonding bases for bonding the aluminum wires. The bonding bases permit easy bonding of the aluminum wires.

The above aspects, features, and advantages of the present invention will become clear from the following description when the same is read in conjunction with the accompanying drawings.

BRIEF DESCRIPTION OF THE DRAWINGS

FIG. 8 is a cross-sectional view of a conventional power module.

DESCRIPTION OF THE PREFERRED EMBODIMENTS

Figure 1:
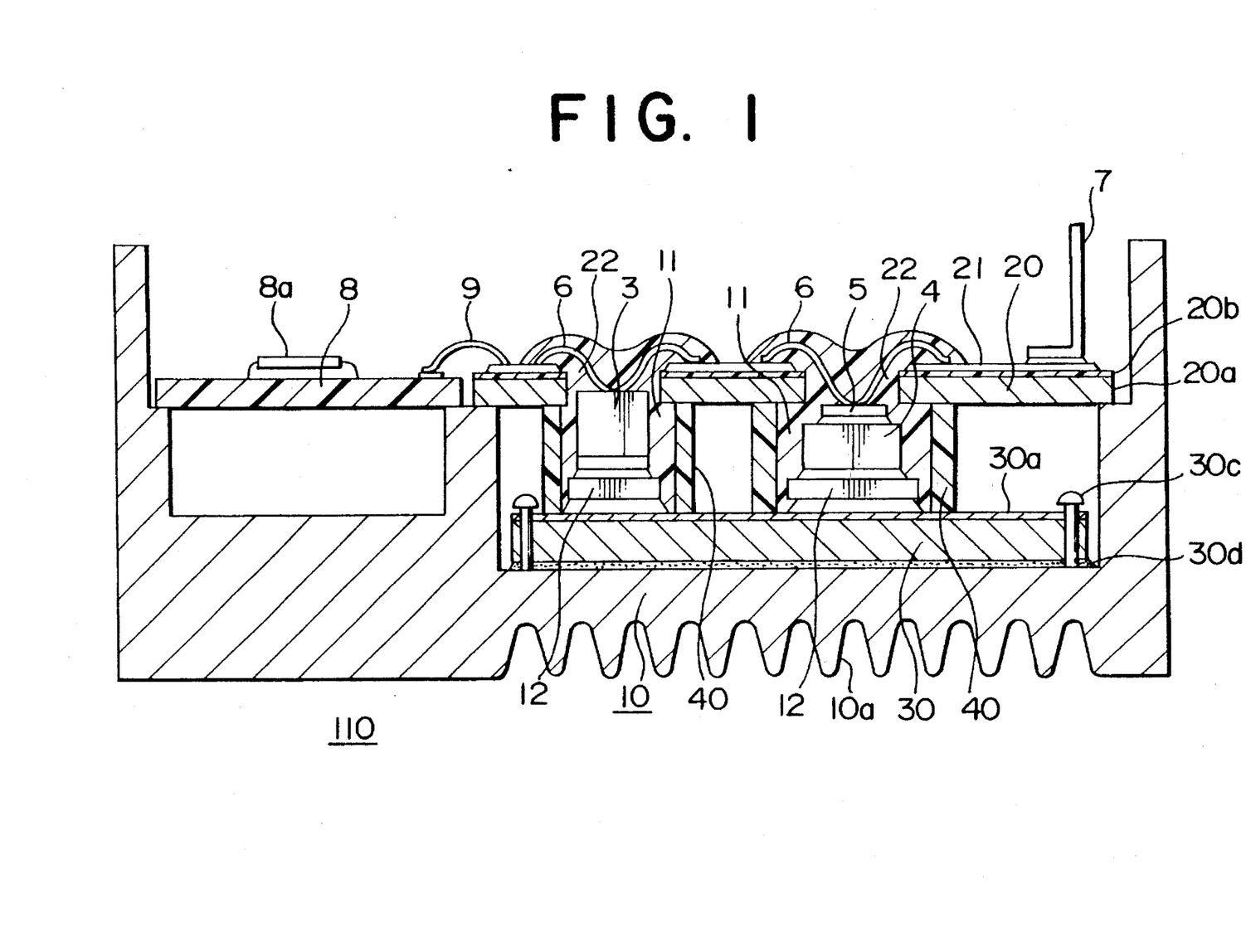
FIG. 1 is a cross-sectional view the power module according to an embodiment of the present invention.

Embodiment 1:

FIG. 1 is a cross-sectional view of the power module according to one exemplary embodiment of the present invention. The same reference numerals apply to identical or equivalent parts to those of the conventional power module illustrated in FIGS. 7 and 8. In the drawing, numeral 110 denotes a power module, numeral 10 a heat radiating container, numeral 10a a serrated section, and numeral 30 an aluminum plate which serves as the metallic heat radiating plate, the surface thereof being covered with a nickel-plated layer 30a for soldering the heat radiating elements to be discussed later. Numeral 30c denotes a pin for fixing the aluminum plate 30 to the heat radiating container 10 and numeral 30d silicone grease for ensuring good heat conductivity between the aluminum plate 30 and the heat radiating container 10. Numeral 12 denotes metallized alumina insulating plates which are inserted between a MOS-FET 5 and the aluminum plate 30, and between a resistor 3 and the aluminum plate 30, respectively, and which are provided with nickel (Ni) plating or copper (Cu) foil on both surfaces thereof. The alumina insulating plates 12 are insulating plates with high heat conductivity which electrically insulate the devices 5 and 3 from the aluminum plate 30 and also efficiently transmit the heat generated by the devices 5 and 3 to the aluminum plate 30. In the case of the MOS-FET 5, solder is present between the MOS-FET 5, the copper heat sink 4, the alumina insulating plate 12, and the aluminum plate 30. In the case of the resistor 3, solder is present between the resistor 3, the alumina insulating plate 12, and the aluminum plate 30. Further, numeral 20 denotes a metallic substrate with a resinous insulating layer 20b formed on the similar aluminum plate 20a to that of the metallic substrate 2 shown in FIG. 8, numeral 21 a circuit pattern formed on the resinous insulating layer 20b, and numeral 22 openings formed in the metallic substrate 20 to match the positions of the heat radiating elements such as the MOS-FET 5 and the resistor 3. The metallic substrate 20 has a heat radiating effect for the circuit pattern 21 and it is rugged enough to serve the purpose since it is disposed and fixed as shown in FIG. 1. Numeral 40 denotes rings which surround the heat radiating elements including a single or a plurality of MOS-FETs 5 and the resistors 3. The rings are placed between the aluminum plate 30 and the metallic substrate 20 and are fixed to the aluminum plate 30. Numeral 11 indicates a silicone gel, a protective material, which is charged in the rings 40 to protect the heat radiating elements and aluminum wires 6 from moisture, etc. The circuit pattern 21 on the metallic substrate 20 is a copper foil circuit pattern which is approximately 100 μm thick. The opening 22 is a hole which is as large as the MOS-FET 5 or the resistor 3. The heat radiator includes the heat radiating container 10 and the metallic heat-radiating plate (aluminum plate) 30.

Figure 2:
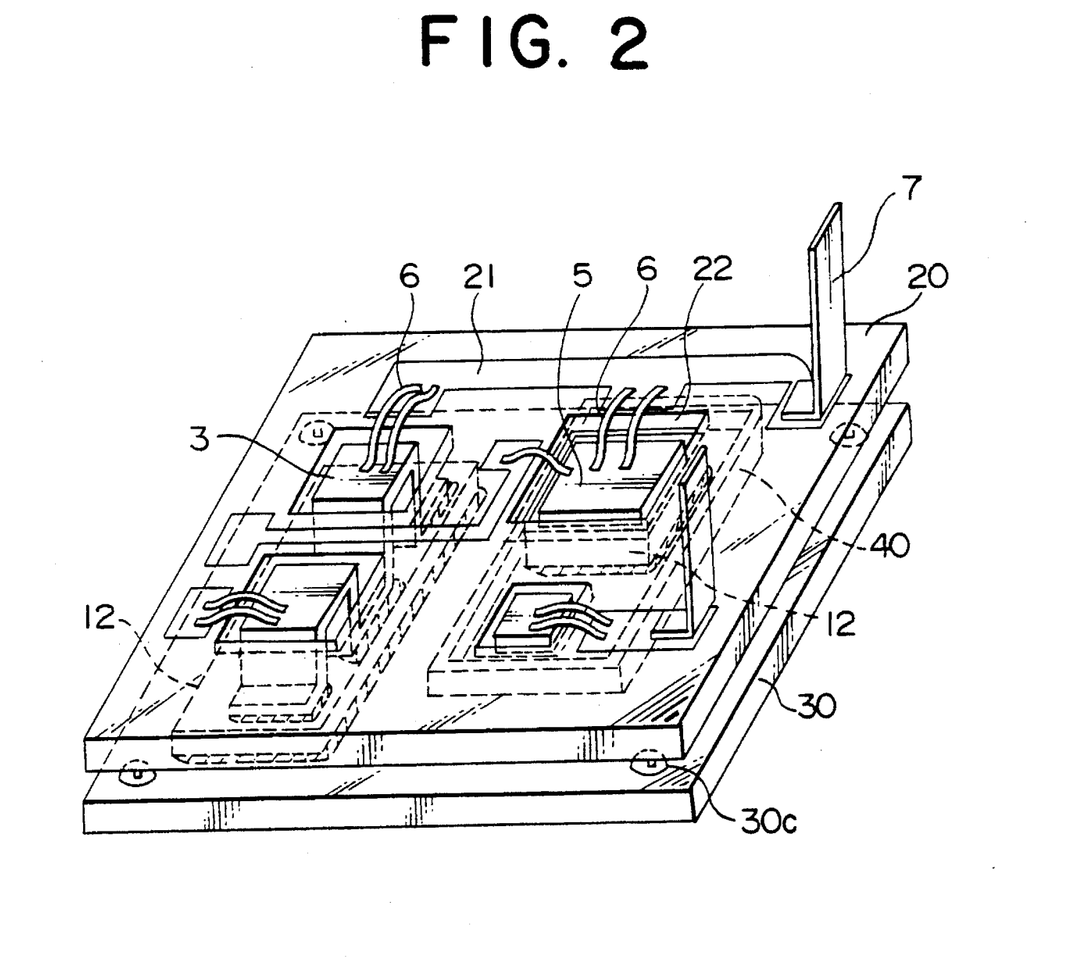
FIG. 2 is a partial perspective view showing the metallic heat radiating plate and the metallic substrate of the power module of FIG. 1.
Figure 3:
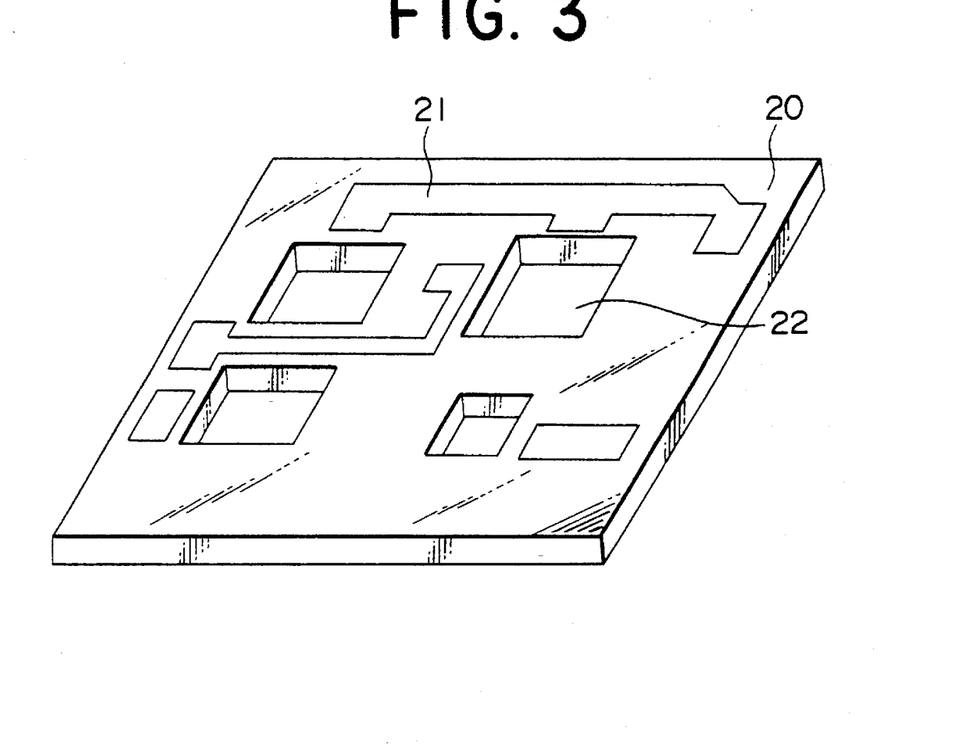
FIG. 3 is a partial perspective view showing the metallic substrate of the power module of FIG. 1.
Figure 4:
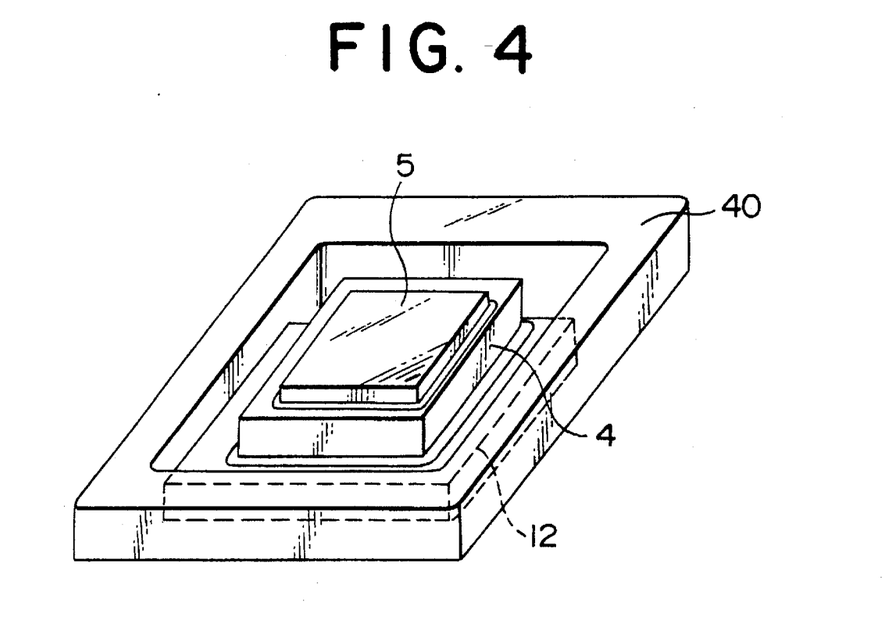
FIG. 4 is a partial perspective view showing the MOS-FET of the power module of FIG. 1.

FIG. 2 is a partial perspective view of the metallic substrate 20 and the aluminum plate 30, and FIG. 3 is a partial perspective view showing only the metallic substrate 20. FIG. 4 is a perspective view showing the MOS-FET 5 in the ring 40.

As it is seen from FIG. 1 through FIG. 4, in the power module 110, the MOS-FET 5 and the resistor 3, which are the heat radiating elements, are mounted on the aluminum plate 30 fixed in close contact with the heat radiating container 10 so as to ensure good heat radiation. The electrical connection for the heat radiating elements being provided on the metallic substrates 20 disposed above the aluminum plate 30, and the metallic substrates 20 being arranged in parallel with spaces allowed between them. The metallic substrates 20 have openings 22 formed above the respective heat radiating elements mounted on the aluminum plate 30. The circuit pattern 21 on the metallic substrate 20 and the heat radiating elements are electrically connected with the aluminum wires 6 or the like through the openings 22. The metallic substrates 20 are fixed to the heat radiating container 10 with an adhesive material (not shown). The circuit board 8 on which the control circuit is mounted is basically the same as a conventional circuit board. The silicone gel 11 for protecting the heat generating elements 3 and 5 and the aluminum wires 6 from moisture, etc. is charged to fill in the rings 40 and to cover the aluminum wires 6 located over the rings.

In the power module having the configuration described above, the heat generated in the MOS-FET 5 is discharged outside through a heat radiating passage which includes a solder layer, the copper heat sink 4, a solder layer, the alumina insulating plate 12, a solder layer, the aluminum plate 30, and the heat radiating container 10. Hence, improved heat radiation is achieved because resinous layers no longer exist in the heat radiating passage, thus minimizing the range for reducing the current value and ON resistance by connecting the MOS-FETs 5 in parallel. The result is fewer MOS-FETs 5 required. In general, the solder layer provides heat conductivity which is about ten times as high as that of the resinous layer.

The alumina insulating plate 12 used in this embodiment is only slightly larger than the MOS-FET 5, and such a small alumina insulating plate 12 generates small thermal stress. Therefore, the thermal fatigue from the thermal stress due to the heat to which the alumina insulating plate 12 is subjected when it is soldered to the aluminum plate 30 or due to the heat generated by switching the MOS-FET 5 causes no reliability problem.

Thus, the circuit incorporating the heat generating elements through which large currents flow and the MOS-FET 5 and the resistor 3 are placed on the aluminum plate 30, the circuit pattern 21 is formed on the metallic substrate 20 located above the aluminum plate 30, and the circuit pattern 21 and the heat radiating elements are electrically connected with the aluminum wires 6 through the holes 22 formed in the metallic substrate 20. This three-dimensional structure increases the degree of freedom for configuring the circuit. The new structure also allows the aforesaid heat radiating metallic plate and the metallic substrate to be made smaller, leading to a reduced size of the completed power module.

Moreover, the silicone gel 11 has only to fill the rings 40 and cover the aluminum wires 6 located over the rings, saving the silicon gel 11.

The ring 40 serves to support the metallic substrate 20 on the back surface thereof as well as preventing the silicone gel 11 from oozing out. The metallic substrate 20 according to this embodiment is supported only by the periphery of the heat radiating container 10 and therefore the metallic substrate 20 flexes when bonding the aluminum wire 6 onto the circuit pattern 21 on the metallic substrate 20, and the aluminum wire 6 may break. To avoid this problem, the ring 40 supports the metallic substrate 20 on the back surface thereof.

In the above embodiment, the aluminum plate 30 provided with nickel plating on the surface thereof is used for the metallic heat radiating plate; however, an aluminum plate with copper plating on the surface thereof may be used instead. Alternatively, a copper plate provided with nickel plating may be used in place of the aluminum plate.

Figure 5:
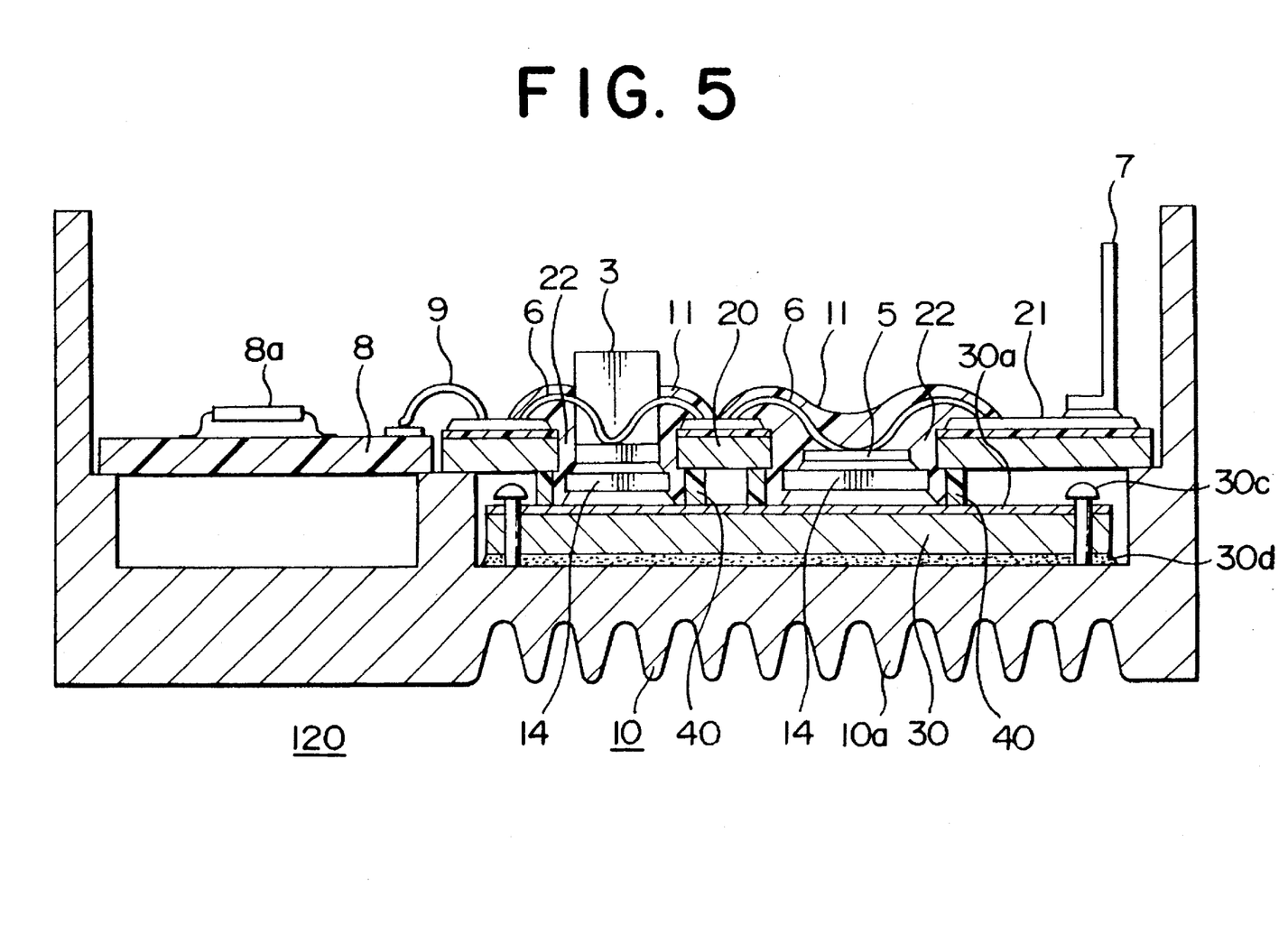
FIG. 5 is a cross-sectional view of the power module according to another embodiment of the present invention.

Embodiment 2:

FIG. 5 is a cross-sectional view of the power module according to another embodiment of the present invention. In order to provide still better heat radiation, a power module 120 according to this embodiment uses a metallized aluminum nitride insulating plate 14 provided with copper (Cu) foil or nickel (Ni) plating for soldering on both sides in place of the copper heat sink 4 and the alumina insulating plate 12 of the heat radiating structure of the MOS-FET 5 and the alumina insulating plate 12 of the heat radiating structure of the resistor 3 in Embodiment 1. The aluminum nitride insulating plate 14 is an insulating plate which has still higher heat conductivity than the alumina insulating plate 12 of Embodiment 1. In the power module according to this embodiment, the distance between the aluminum plate 30 (metallic heat radiating plate) and the metallic substrate 20 can be shortened by the length of the copper heat sink 4. Thus, the power module according to this embodiment permits further improved heat radiation and a further reduced size compared with the power module according to Embodiment 1.

Figure 6:
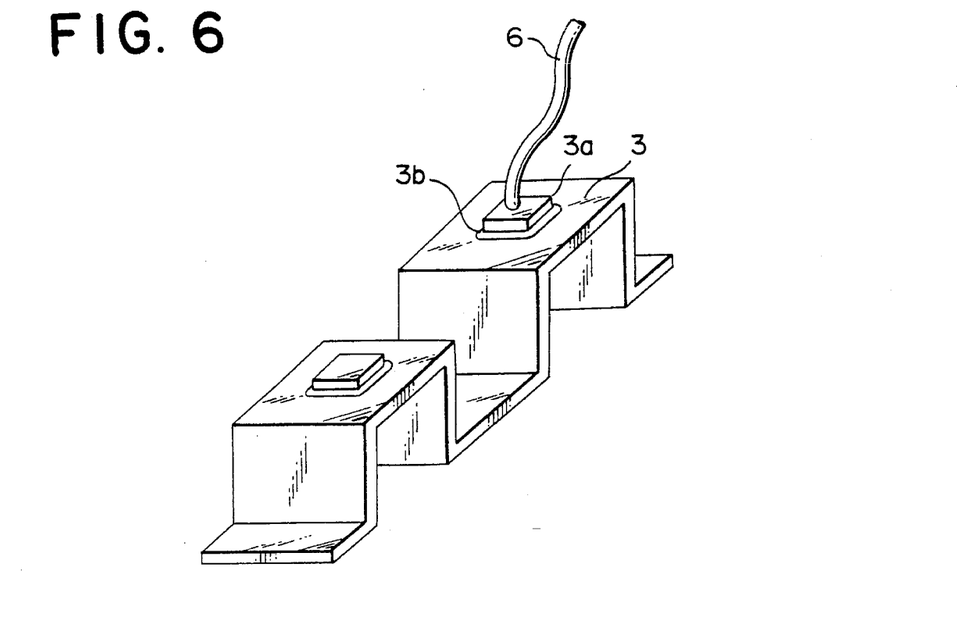
FIG. 6 is a perspective view showing an embodiment of a resistor which is a heat generating element in the power module in accordance with the present invention.

Embodiment 3:

This embodiment relates to the connection between the resistor and the aluminum wire in the embodiments described above. FIG. 6 is a perspective view showing the resistor 3 in accordance with this embodiment mounted on the aluminum plate 30 (metallic heat radiating plate). In the embodiments described above, since the metallic substrate 20 on which the circuit pattern 21 is formed is located above the resistor 3, it is desirable to make connection above the resistor 3 in order to minimize the required length of the aluminum wire 6. The resistor 3, however, is made of an alloy of copper and nickel and the aluminum wire 6 cannot be bonded to the resistor 3 as it is. In the conventional power module, the bottom surface of the resistor was connected and fixed to the circuit pattern with solder rather than directly connecting the aluminum wire to the resistor. Hence, in this embodiment, an aluminum base 3a which serves as a bonding base is fixed to the bonding portion of the resistor 3 with solder 3b so as to bond the aluminum wire 6 to the aluminum base 3a, thereby making it possible to directly connect the aluminum wire 6 to the resistor 3.

Thus, in the power module according to the first aspect of the present invention, all heat generating elements such as MOS-FETs are mounted by soldering onto a metallic heat radiating plate made of an aluminum plate or the like with plated surface via an insulating plate (alumina insulator or aluminum nitride insulating plate), and the circuit pattern or the like for the heat generating elements is formed on a metallic substrate provided above the metallic heat radiating plate. The metallic substrate has openings located at points above the respective heat generating elements, the heat generating elements and the metallic substrate being connected with aluminum wires through the openings. This configuration eliminates the need of the resinous insulating layer for forming the circuit pattern or the like on the metallic heat radiating plate on which the heat generating elements are mounted. The absence of the resinous layers in the heat radiating passage of the heat generating elements has led to improved heat radiation efficiency. Further, the improved heat radiation of the metallic heat radiating plate has led to a smaller range for reducing the current value and ON resistance by connecting a plurality of MOS-FETs in parallel as in the conventional power module. In addition, the three-dimensional structure comprised of the plate and the substrate, namely, the metallic heat radiating plate with the heat generating elements mounted on and the metallic substrate on which the circuit pattern is formed, allows openings to be made in any desired positions in the metallic substrate. Through the opening, the heat generating element and the circuit pattern on the metallic substrate can be freely connected with the aluminum wire. This allows a simpler circuit pattern which leads to a reduced size of the substrate, resulting in a reduced size of the whole power module. Thus, according to the first aspect of the present invention, even less expensive power modules can be provided.

In the power module according to the second aspect of the present invention, a ring surrounding the MOS-FET is provided between the metallic heat radiating plate and the metallic substrate, and the protective material for protecting the MOS-FET and the aluminum wire from moisture is charged only in the ring; therefore, the required quantity of the protective material can be reduced, permitting further cost reduction.

In the power module according to the third embodiment of the invention, the heat generating elements, especially the resistors, are provided with bonding bases made of aluminum for bonding the aluminum wires. The bonding bases allow easy bonding of the aluminum wires.

Thus, according to the present invention, a power module can be provided, which achieves a higher degree of freedom of designing the heat radiating structure and reduced cost owing to a reduced number of MOS-FETs used, smaller substrates, and a reduced quantity of silicone gel required.

What is claimed is:

1. A power module comprising:

a heat radiator;

an insulating plate;

a heat generating element fixed to said heat radiator with said insulating plate interposed between said heat radiator and said heat generating element;

a metallic substrate disposed on said opposite side of said heat generating element from said heat radiator, said metallic substrate having a top surface, a circuit pattern for said heat generating element on the top surface, and an opening opposite said heat generating element, so that said heat generating element is at least partially exposed through the opening; and a metallic wire connecting said circuit pattern to said heat generating element through the opening in said metallic substrate.

2. The power module according to claim 1, further comprising a ring which is placed between said heat radiator and said metallic substrate and which surrounds said heat generating element, and a protective material disposed in said ring, covering said heat generating element and said metallic wire.

3. The power module according to claim 1, wherein said heat generating element is provided with a bonding base to which said metallic wire is connected and fixed.

4. A power module comprising:

a thermally conductive heat radiating plate;

a plurality of heat generating elements thermally coupled to said heat radiating plate;

a metallic substrate disposed opposite said heat radiating plate, said metallic substrate including a top surface and a bottom surface, the top surface including a circuit pattern, said metallic substrate further including a plurality of apertures, each aperture being positioned opposite a corresponding heat generating element; and a plurality of metallic wires, each wire connecting one of said plurality of heat generating elements to said circuit pattern through a corresponding aperture.

5. The power module of claim 4 further comprising:

a plurality of rings disposed between said heat radiating plate and said metallic substrate, each ring corresponding to one of the plurality of apertures and surrounding a corresponding heat generating element, the plurality of rings supporting said metallic substrate; and a protective material disposed in said plurality of rings covering said heat generating elements and said metallic wires.

6. The power module of claim 5 wherein said heat radiating plate includes an aluminum plate.

7. The power module of claim 5 wherein at least one of the plurality of heat generating elements includes a composite structure having a heat sink, a first electrically insulating thermally conductive plate, and a MOS-FET soldered to the heat sink, the heat sink being soldered to the first electrically insulating thermally conductive plate.

8. The power module of claim 7 wherein at least one of the plurality of heat generating elements includes a composite structure having a second electrically insulating thermally conductive plate and a resistor soldered to the second electrically insulating thermally conductive plate.

9. The power module of claim 8 wherein the first and second electrical insulating plates include alumina.

10. The power module of claim 5 wherein at least one of the plurality of heat generating elements includes a composite structure having a third electrically insulating thermally conductive plate and a MOS-FET soldered to the third electrically insulating thermally conductive plate.

11. The power module of claim 10 wherein at least one of the plurality of heat generating elements includes a composite structure having a fourth electrically insulating thermally conductive plate and a second resistor soldered to the fourth electrically insulating thermally conductive plate.

12. The power module of claim 11 wherein the third and fourth electrically insulating thermally conductive plates include aluminum nitride.

* * * * *